(12) United States Patent
Huang et al.

(10) Patent No.: US 10,579,116 B2
(45) Date of Patent: Mar. 3, 2020

(54) INTEGRATED CIRCUIT DEVICE AND SYSTEM ON A CHIP (SOC) FOR REDUCING BOOT TIME

(71) Applicant: REALTEK SEMICONDUCTOR CORP., Hsinchu (TW)

(72) Inventors: I-Hsun Huang, Hsinchu (TW); Cheng-Yu Chen, New Taipei (TW); An-Ming Lee, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 117 days.

(21) Appl. No.: 15/896,158

(22) Filed: Feb. 14, 2018

(65) Prior Publication Data

US 2018/0341303 A1   Nov. 29, 2018

(30) Foreign Application Priority Data

May 24, 2017   (TW) ............... 106117207 A

(51) Int. Cl.
| | |
|---|---|
| *G06F 1/24* | (2006.01) |
| *G06F 1/06* | (2006.01) |
| *G06F 13/16* | (2006.01) |
| *G06F 1/12* | (2006.01) |
| *G11C 7/10* | (2006.01) |
| *G11C 7/22* | (2006.01) |

(52) U.S. Cl.
CPC ............ *G06F 1/24* (2013.01); *G06F 1/06* (2013.01); *G06F 1/12* (2013.01); *G06F 13/1689* (2013.01); *G06F 2211/1097* (2013.01); *G11C 7/106* (2013.01); *G11C 7/222* (2013.01)

(58) Field of Classification Search
None
See application file for complete search history.

(56) References Cited

U.S. PATENT DOCUMENTS

| | | | |
|---|---|---|---|
| 7,958,285 B1 * | 6/2011 | Chiu ................. | G06F 5/10 710/52 |
| 8,228,084 B1 * | 7/2012 | Chen ................. | G01R 31/3004 324/750.1 |
| 8,330,477 B1 * | 12/2012 | Wu ................. | G01R 31/318371 324/750.3 |
| 8,886,864 B1 * | 11/2014 | Sung ................. | G06F 13/387 710/300 |
| 2017/0048057 A1 * | 2/2017 | Kim ................. | H04L 7/0331 |
| 2017/0351624 A1 * | 12/2017 | Chen ................. | G06F 13/382 |

* cited by examiner

*Primary Examiner* — Danny Chan
(74) *Attorney, Agent, or Firm* — Li & Cai Intellectual Property (USA) Office

(57) ABSTRACT

A system on a chip (SOC) and an integrated circuit device having the same are disclosed. The SOC has a chip controller and a first chip element which do not need to operate according to a reference clock signal, and the SOC has a second chip element which needs to operate according to the reference clock signal. During resetting of a main system processor, the chip controller of the SOC is reset simultaneously. After the chip controller finishes resetting, the first chip element is then reset. After the main system processor finishes resetting, the second chip element of the SOC starts to reset. Accordingly, during the resetting of the main system processor, the SOC is reset simultaneously, thereby reducing the boot time of the integrated circuit device.

20 Claims, 5 Drawing Sheets

INTEGRATED CIRCUIT DEVICE AND SYSTEM ON A CHIP (SOC) FOR REDUCING BOOT TIME

BACKGROUND

1. Technical Field

The present disclosure relates to a system on a chip (SOC) and an integrated circuit device having the same, and in particular, to a system on a chip (SOC) and an integrated circuit device having the same for reducing the boot time of the integrated circuit device.

2. Description of Related Art

Generally speaking, users press a power button to start an electronic device. The electronic device will enter the application interface after a boot time. FIG. 1A shows a diagram of booting a conventional integrated circuit device. As shown in FIG. 1A, an integrated circuit device 10 is set on a mother board of an electronic device (not shown in FIGs). The integrated circuit device 10 includes a main system processor 12 and a system on a chip (SOC) 14. The main system processor 12 is the main processing center of the electronic device for executing all kinds of analysis, calculation, and control. Specifically, it may be a central processor, a microprocessor, or an embedded processor, etc. The SOC 14 processes other secondary functions in response to the electronic device. The SOC 14 is coupled to the main system processor 12. For example, the SOC 14 may be a chip for assisting the main system processor 12 processing the audio function, storage function, or other functions, etc.

The main system processor 12 executes a reset operation (e.g., booting) according to a booting signal Pon, and then transmits a sideband signal PERST (taken as the trigger condition of the system rebooting) and a reference clock signal CLKr to the SOC 14. More specifically, referring to FIGS. 1A and 1B, when users press the power button to start the electronic device, the main system processor 12 receives the booting signal Pon with a high-level to execute the reset operation (e.g., booting), and then enters a booting state. In the booting state, the main system processor 12 generates the sideband signal PERST with a low-level for a period of time T1. In the sideband signal PERST with the low-level, the frequency of the reference clock signal CLKr is unstable. In the sideband signal PERST with a high-level, the frequency of the reference clock signal CLKr is stable.

Therefore, in the architecture of the conventional integrated circuit device 10, the SOC 14 begins to reset only after the main system processor 12 finishes resetting. After the SOC 14 finishes resetting, the booting state of the integrated circuit device 10 ends. From the aforementioned description, the SOC 14 needs to wait for the main system processor 12 to finish resetting before starting to reset, so that the entire length of the boot time is long. Therefore, if the length of the boot time can be shortened, users would prefer the integrated circuit device 10.

SUMMARY

One objective of the present disclosure is to provide a system on a chip (SOC) and an integrated circuit device having the same. During the resetting of a main system processor, the SOC will be reset simultaneously to shorten the booting time of the integrated circuit device, thereby reducing the waiting time for users during the booting sequence of the integrated circuit device.

An exemplary embodiment of the present disclosure provides an SOC coupled to a main system processor of an integrated circuit device. The SOC is used for executing reset operation according to a sideband signal with a low-level and a reference clock signal generated from the main system processor. The SOC includes a chip controller, a first chip element, a second chip element, and a clock detector. The chip controller is configured for executing reset when receiving the sideband signal with the low-level. The first chip element is coupled to the chip controller and is controlled by the chip controller. The first chip element does not need to operate according to the reference clock signal. The second chip element is coupled to the chip controller and is controlled by the chip controller. The second chip element needs to operate according to the reference clock signal. The clock detector is configured for receiving the reference clock signal and a fixed clock signal. When there is a special ratio relationship between the reference clock signal and the fixed clock signal, the clock detector generates a notification signal to the chip controller. After the chip controller finishes resetting, the chip controller transmits a start signal to the first chip element to reset the first chip element. After the chip controller finishes resetting and receives the notification signal, the chip controller transmits the start signal and the reference clock signal to the second chip element to reset the second chip element.

An exemplary embodiment of the present disclosure provides an integrated circuit device. The integrated circuit device includes a main system processor and an SOC. The main system processor generates a sideband signal and a reference clock signal and generates the sideband signal with a low-level in a booting state. The SOC is coupled to the main system processor. The SOC includes a chip controller, a first chip element, a second chip element, and a clock detector. The chip controller is configured for executing reset when receiving the sideband signal with the low-level. The first chip element is coupled to the chip controller and is controlled by the chip controller. The first chip element does not need to operate according to the reference clock signal. The second chip element is coupled to the chip controller and is controlled by the chip controller. The second chip element needs to operate according to the reference clock signal. The clock detector is configured for receiving the reference clock signal and a fixed clock signal. When there is a special ratio relationship between the reference clock signal and the fixed clock signal, the clock detector generates a notification signal to the chip controller. After the chip controller finishes resetting, the chip controller transmits a start signal to the first chip element to reset the first chip element. After the chip controller finishes resetting and receives the notification signal, the chip controller transmits the start signal and the reference clock signal to the second chip element to reset the second chip element.

To sum up, the exemplary embodiments of the present disclosure provide the SOC and the integrated circuit device having the same. The SOC has a chip controller which does not need to operate according to a reference clock signal (taken as the main processing center of the SOC, e.g., the microprocessor), a first chip element (e.g., the flash memory controller or DDR controller), and a second chip element which needs to operate according to the reference clock signal (e.g., the bus controller). During the resetting of a main system processor, the chip controller of the SOC is reset simultaneously. The first chip element is reset after the chip controller finishes resetting. The second chip element of the SOC starts to reset only after the main system processor finishes resetting. Accordingly, during the resetting of the main system processor, the SOC is reset simultaneously, thereby reducing the entire boot time of the integrated circuit device.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1A:
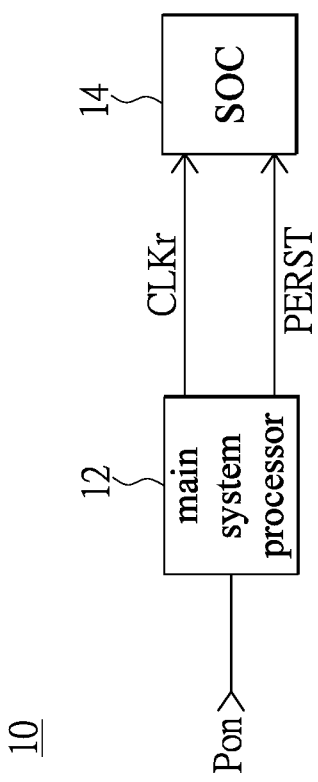
FIG. 1A shows a diagram of a booting sequence of a conventional integrated circuit device.
Figure 1B:
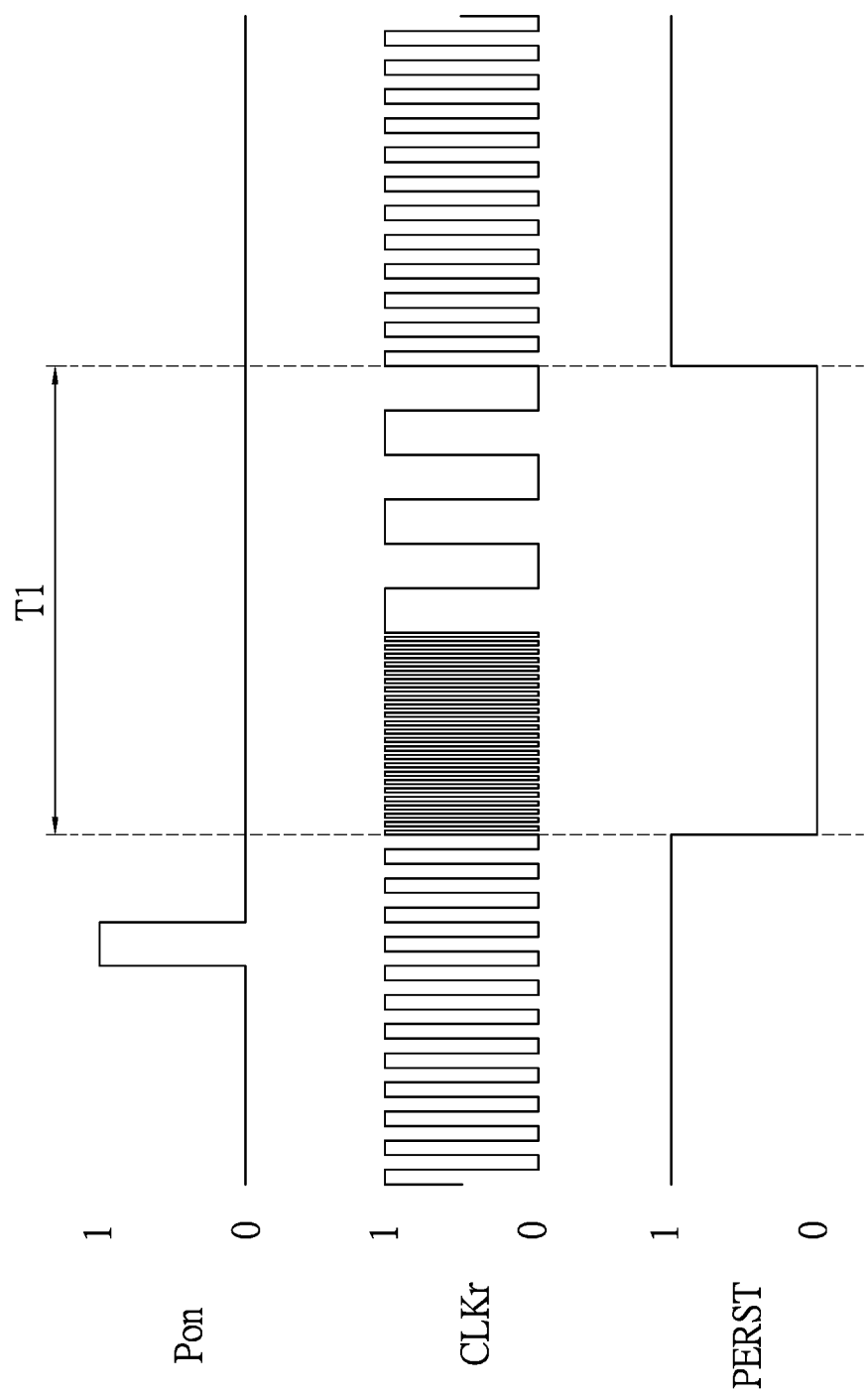
FIG. 1B shows a waveform diagram of a booting sequence of a conventional integrated circuit device.

Reference will now be made in detail to the exemplary embodiments of the present disclosure, examples of which are illustrated in the accompanying drawings. Wherever possible, the same reference numbers are used in the drawings and the description to refer to the same or like parts.

Figure 2:
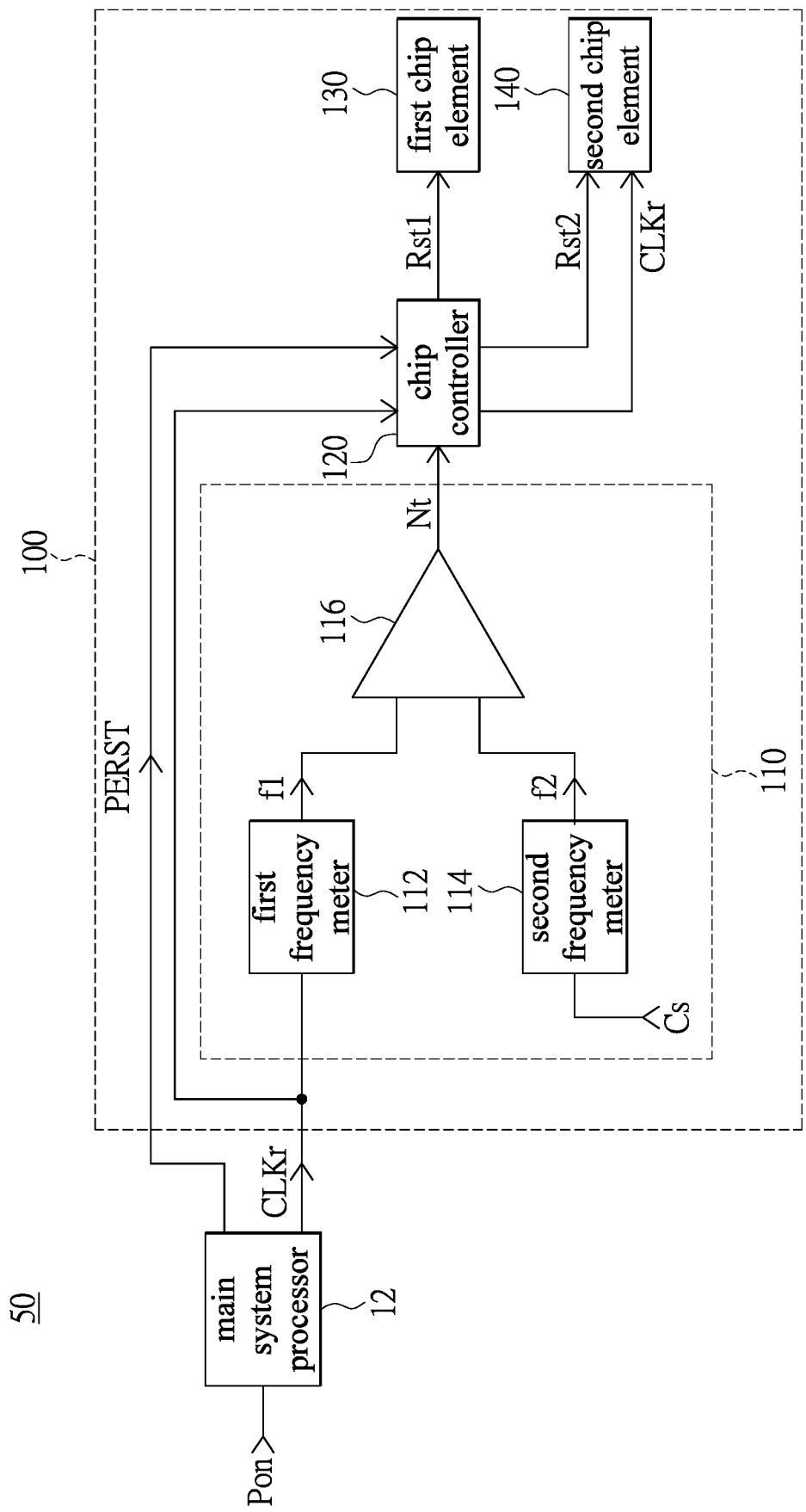
FIG. 2 shows a diagram of an integrated circuit device according to an embodiment of the disclosure.

Reference is first made to FIG. 2, which shows a diagram of an integrated circuit device according to an embodiment of the present disclosure. An integrated circuit device 50 is set on a mother board of an electronic device (not shown in FIGs). The integrated circuit device 50 includes a main system processor 12 and a system on a chip (SOC) 100. The main system processor 12 is the main processing center of the electronic device for executing all kinds of analysis, calculation, and control. Specifically, it may be a central processor, a microprocessor, or an embedded processor, etc.

Figure 3:
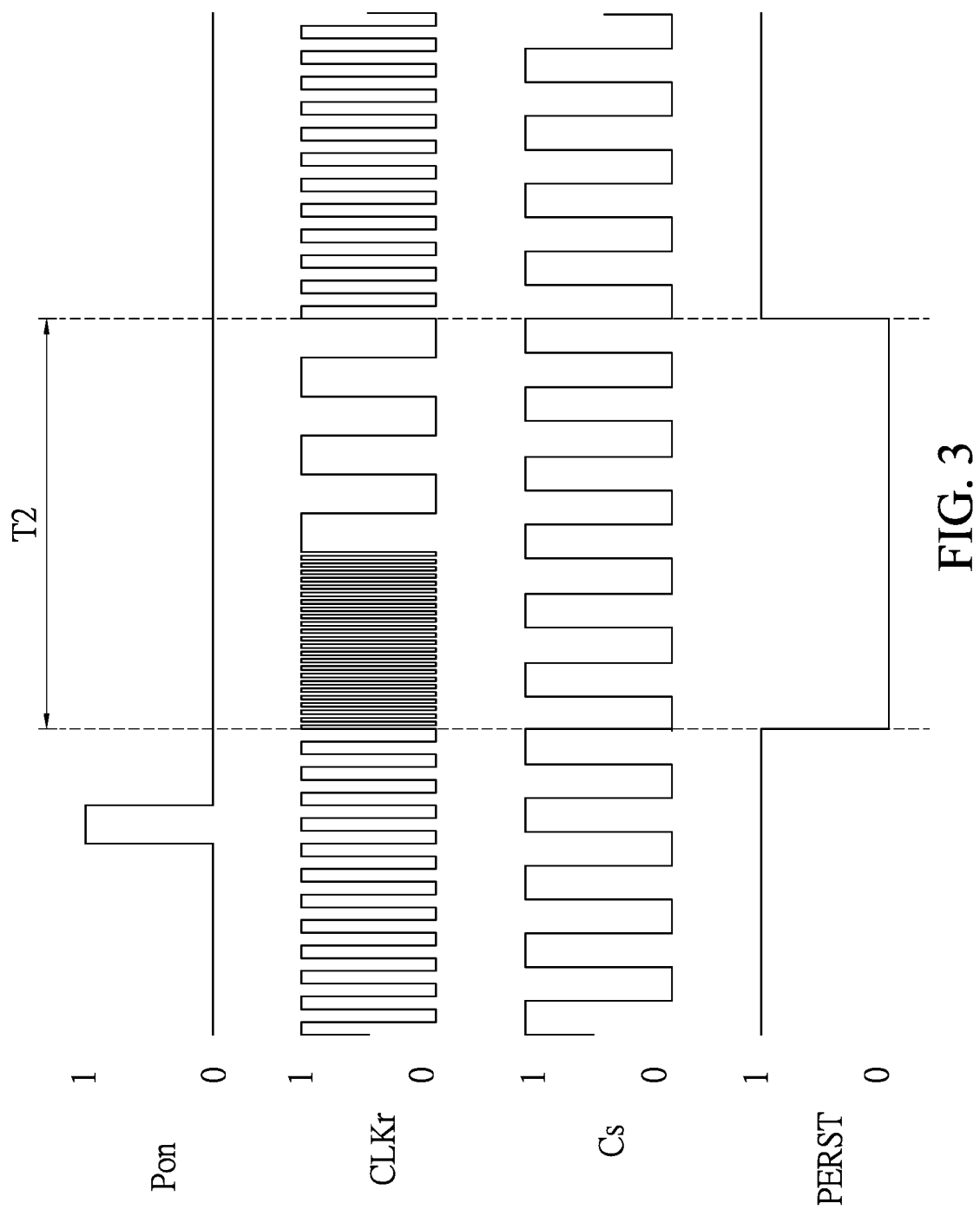
FIG. 3 shows a waveform diagram of a booting sequence of an integrated circuit device according to an embodiment of the disclosure.

The main system processor 12 executes a reset operation (e.g., booting) according to a booting signal Pon and then transmits a sideband signal PERST and a reference clock signal CLKr to the SOC 100. Referring to FIGS. 2 and 3, in the present disclosure, when users press the power button to start the electronic device, the main system processor 12 receives the booting signal Pon with a high-level to execute the reset operation (e.g., booting) and then enters a booting state. In the booting state, the main system processor 12 generates the sideband signal PERST with the low-level for a period of time T2. In the sideband signal PERST with the low-level, the frequency of the reference clock signal CLKr is unstable. In the sideband signal PERST with the high-level, the frequency of the reference clock signal CLKr is stable.

Returning to FIG. 2, the SOC 100 processes other secondary functions in response to the electronic device. The SOC 100 is coupled to the main system processor 12. In the present disclosure, the SOC 100 may be a chip for assisting the main system processor 12 processing the audio function, storage function, or other functions, etc., but the present disclosure is not limited thereto.

The SOC 100 includes a chip controller 120, a first chip element 130, a second chip element 140, and a clock detector 110. The chip controller 120 is reset when receiving the sideband signal with the low-level. The first chip element 130 is coupled to the chip controller 120 and is controlled by the chip controller 120. The second chip element 140 is coupled to the chip controller 120 and is controlled by the chip controller 120. In the present disclosure, the chip controller 120 is the main processing center of the SOC 100, e.g., the microprocessor. The first chip element 130 does not need to operate according to the reference clock signal CLKr, e.g., the flash memory controller or the DDR controller. The second chip element 140 needs to operate according to the reference clock signal CLKr, e.g., the bus controller.

The clock detector 110 receives the reference clock signal CLKr and a fixed clock signal Cs. The clock detector 110 detects whether there is a special ratio relationship between the reference clock signal CLKr and the fixed clock signal Cs. In the present disclosure, the special ratio relationship is the relationship between the frequency of the reference clock signal CLKr and the frequency of the fixed clock signal Cs. For example, in the sideband signal PERST with the high-level, the frequency of the reference clock signal CLKr is stable. Therefore, the special ratio relationship is designed based on the actual architecture above, e.g., the frequency of the reference clock signal CLKr (e.g., 100 MHz) being four times the frequency of the fixed clock signal Cs (e.g., 25 MHz).

When there is the special ratio relationship between the reference clock signal CLKr and the fixed clock single Cs, the clock detector 110 generates a notification signal Nt (indicating that the notification signal Nt in the present embodiment is at the high-level) to the chip controller 120. Conversely, when there is no special ratio relationship between the reference clock signal CLKr and the fixed clock single Cs, the clock detector 110 does not generate the notification signal Nt (indicating that the notification signal Nt in the present embodiment is at the low-level) to the chip controller 120.

More specifically, the clock detector 110 includes a first frequency meter 112, a second frequency meter 114, and a comparator 116. The first frequency meter 112 receives the reference clock signal CLKr and calculates the frequency of the reference clock signal CLKr to generate a first frequency f1. The second frequency meter 114 receives the fixed clock signal Cs and calculates the frequency of the fixed clock signal Cs to generate a second frequency f2. The comparator 116 is coupled to the first frequency meter 112 and the second frequency meter 114. The comparator 116 compares the first frequency f1 with the second frequency f2. When the comparator 116 determines that there is the special ratio relationship between the first frequency f1 and the second frequency f2, it indicates that the reference clock signal CLKr has a stable frequency. At this time, the comparator 116 generates the notification signal Nt (e.g., the notification signal Nt with the high-level) to the chip controller 120.

When the comparator 116 determines that there is no special ratio relationship between the first frequency f1 and the second frequency f2, it indicates that the reference clock signal CLKr has an unstable frequency. At this time, the comparator 116 does not generate the notification signal Nt (e.g., the notification signal Nt with the low-level) to the chip controller 120. Persons of ordinary skill in this field of technology should be familiar with the calculation method of the first frequency meter 112 and that of the second frequency meter 114, so that detailed description thereon is omitted herein.

Therefore, during the resetting of the main system processor 12 (e.g., the sideband signal PERST is low-level), the reference clock signal CLKr has an unstable frequency. There is no special ratio relationship between the reference clock signal CLKr and the fixed clock signal Cs. The clock detector 110 does not generate the notification signal Nt (e.g., the notification signal Nt with the low-level) to the chip controller 120. After finishing resetting the main system processor 12 (e.g., the sideband signal PERST is high-level), the reference clock signal CLKr has a stable frequency. There is the special ratio relationship between the reference clock signal CLKr and the fixed clock signal Cs. The clock detector 110 will generate the notification signal Nt (e.g., the notification signal Nt with the high-level) to the chip controller 120.

In the present disclosure, the fixed clock signal Cs can be generated by a crystal oscillator (not shown in FIGs), other oscillators, or etc. The present disclosure is not limited thereto.

Referring to FIGS. 2-3, after the chip controller 120 receives the sideband signal PERST with the low-level, the chip controller 120 is reset. After resetting the chip controller 120, the chip controller 120 transmits a start signal Rst1 to the first chip element 130 to reset the first chip element 130. After finishing resetting the chip controller 120 and receiving the notification signal Nt (e.g., the notification signal Nt with the high-level), the chip controller 120 transmits the start signal Rst2 and the reference clock signal CLKr to the second chip element 140 to reset the second chip element 140.

From the aforementioned exemplary embodiments, the SOC 100 has a chip controller 120 which does not need to operate according to a reference clock signal CLKr (taken as the main processing center of the SOC 100, e.g., the microprocessor), a first chip element 130 (e.g., the flash memory controller or the DDR controller), and a second chip element 140 which needs to operate according to the reference clock signal CLKr (e.g., the bus controller). During the resetting of the main system processor 12, the chip controller 120 of the SOC 100 is reset simultaneously. After the chip controller 120 finishes resetting, the first chip element 130 is then reset. The second chip element 140 of the SOC 100 starts to reset only after the main system processor 12 finishes resetting. Since the reset time of the chip controller 120 is longer than the reset time of the first chip element 130 and the second chip element 140, resetting the main system processor 12 and the chip controller 130 simultaneously can reduce the entire length of the boot time of the integrated circuit device 50, thereby reducing the waiting time of users for the booting sequence of the integrated circuit device 50.

Figure 4:
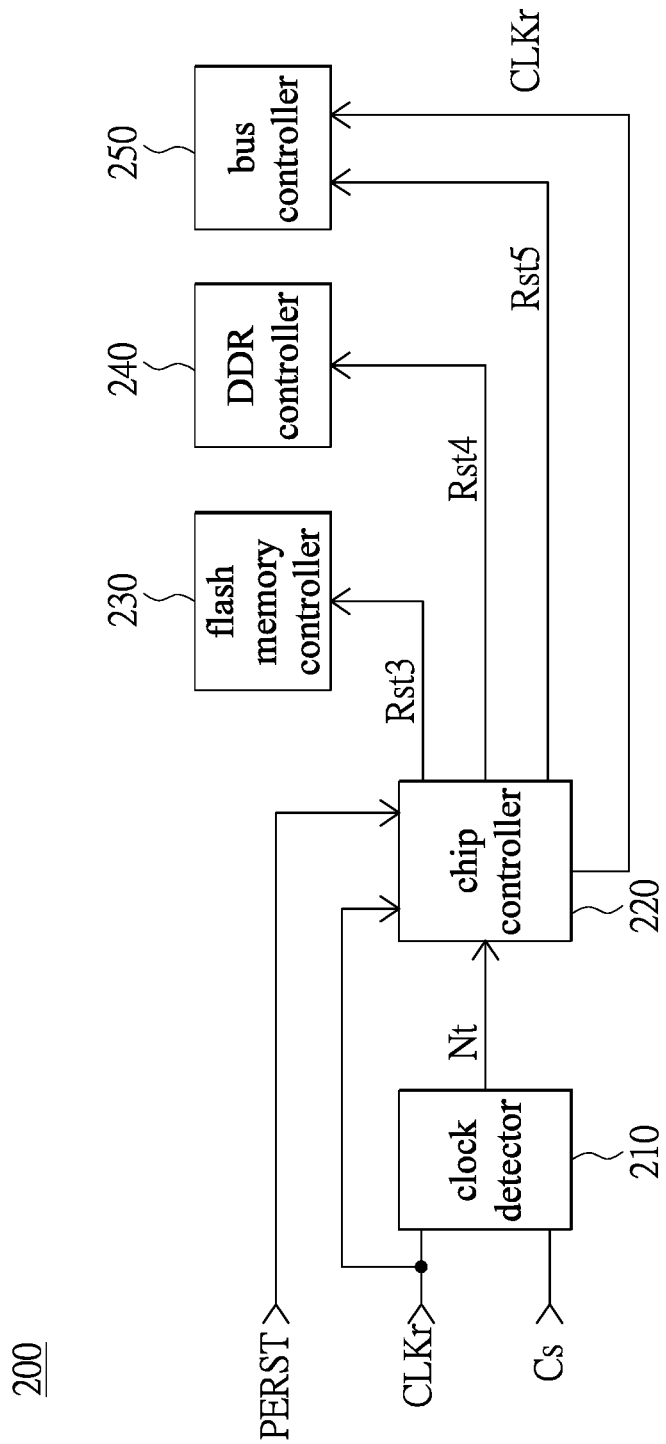
FIG. 4 shows a diagram of an SOC being a non-volatile storage device according to another embodiment of the disclosure.

A non-volatile storage device is taken as example of the SOC 200 in the following embodiment for illustration. As shown in FIG. 4, the SOC 200 has a clock detector 210, a chip controller 220, a flash memory controller 230, a DDR controller 240, and a bus controller 250. The chip controller 220 is coupled to the clock detector 210, the flash memory controller 230, the DDR controller 240, and the bus controller 250. The operation of the clock detector 210 and the chip controller 220 of this embodiment can be inferred from the clock detector 110 and the chip controller 120 of the previous embodiment, so that detailed description thereon are omitted herein. The difference is that: the flash memory controller 230 and the DDR controller 240 do not need to operate according to the reference clock signal CLKr (similar to the first chip element 130 of the previous embodiment) and the bus controller 250 needs to operate according to the reference clock signal CLKr (similar to the second chip element 140 of the previous embodiment).

Therefore, when users press the power button to start the electronic device, the main system processor 12 receives the booting signal Pon with the high-level to execute the reset operation (e.g., booting) and then enters a booting state. In the booting state, the main system processor 12 generates the sideband signal PERST with the low-level for a period of time. The chip controller 220 will be reset according to the sideband signal PERST with the low-level. After the chip controller 220 finishes resetting, the chip controller 220 respectively transmits the start signals Rst3 and Rst4 to the flash memory controller 230 and the DDR controller 240 to reset the flash memory controller 230 and the DDR controller 240.

After the chip controller 220 finishes resetting and receives the notification signal Nt (e.g., the notification signal Nt with the high-level), it indicates that the reference clock signal CLKr has a stable frequency. At this time, the chip controller 220 transmits the start signals RST5 and the reference clock signal CLKr to the bus controller 250 to reset the bus controller 250.

In summary, the present disclosure provides the SOC and the integrated circuit device having the same. During the resetting of the main system processor, the electronic elements which do not need to operate according to the reference clock signal (e.g., the chip controller and the first chip element) will be reset simultaneously, and the electronic elements which need to operate according to the reference clock signal (e.g., the second chip element) will start to reset after the main system processor is finished resetting. Accordingly, the present disclosure provides the SOC and the integrated circuit device having the same which shorten the entire length of the booting time of the integrated circuit device, thereby reducing the waiting time of users for the booting sequence of the integrated circuit device.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A system on a chip (SOC), coupled to a main system processor of an integrated circuit device and used for executing reset operation according to a sideband signal with a low-level and a reference clock signal generated from the main system processor, the SOC comprising:
   a chip controller configured for executing a reset when receiving the sideband signal with the low-level;
   a first chip element coupled to the chip controller and controlled by the chip controller, wherein the first chip element does not need to operate according to the reference clock signal;

a second chip element coupled to the chip controller and controlled by the chip controller, wherein the second chip element needs to operate according to the reference clock signal; and a clock detector configured for receiving the reference clock signal and a fixed clock signal, wherein when there is a specific ratio relationship between the reference clock signal and the fixed clock signal, the clock detector generates a notification signal to the chip controller;

wherein after the chip controller finishes resetting, the chip controller transmits a start signal to the first chip element to reset the first chip element;

wherein after the chip controller finishes resetting and receives the notification signal, the chip controller transmits the start signal and the reference clock signal to the second chip element to reset the second chip element.

2. The SOC according to claim 1, wherein the clock detector comprises:

a first frequency meter receiving the reference clock signal and calculating the frequency of the reference clock signal to generate a first frequency;

a second frequency meter receiving the fixed clock signal and calculating the frequency of the fixed clock signal to generate a second frequency; and a comparator coupled to the first frequency meter and the second frequency meter and comparing the first frequency and the second frequency;

wherein when there is the specific ratio relationship between the first frequency and the second frequency, the comparator generates the notification signal to the chip controller.

3. The SOC according to claim 1, wherein the specific ratio relationship is the relationship between the frequency of the reference clock signal and the frequency of the fixed clock signal.

4. The SOC according to claim 1, wherein the frequency of the fixed clock signal is lower than the frequency of the reference clock signal.

5. The SOC according to claim 1, wherein the first chip element is a flash memory controller or a double data rate (DDR) controller.

6. The SOC according to claim 1, wherein the second chip element is a bus controller.

7. The SOC according to claim 1, wherein when the sideband signal is at the low-level, the frequency of the reference clock signal generated from the main system processor is unstable.

8. The SOC according to claim 1, wherein after the main system processor generates the sideband signal with the low-level for a period of time, the main system processor generates the sideband signal with a high-level.

9. The SOC according to claim 8, wherein when the sideband signal is at the high-level, the frequency of the reference clock signal generated from the main system processor is stable.

10. The SOC according to claim 1, wherein the fixed clock signal is generated from an oscillator.

11. An integrated circuit device, comprising:

a main system processor generating a sideband signal and a reference clock signal, and generating the sideband signal with a low-level in a booting state;

a system on a chip (SOC) coupled to the main system processor and including:

a chip controller configured for executing a reset when receiving the sideband signal with the low-level;

a first chip element coupled to the chip controller and controlled by the chip controller, wherein the first chip element does not need to operate according to the reference clock signal;

a second chip element coupled to the chip controller and controlled by the chip controller, wherein the second chip element needs to operate according to the reference clock signal; and a clock detector configured for receiving the reference clock signal and a fixed clock signal, wherein when there is a specific ratio relationship between the reference clock signal and the fixed clock signal, the clock detector generates a notification signal to the chip controller;

wherein after the chip controller finishes resetting, the chip controller transmits a start signal to the first chip element to reset the first chip element;

wherein after the chip controller finishes resetting and receives the notification signal, the chip controller transmits the start signal and the reference clock signal to the second chip element to reset the second chip element.

12. The integrated circuit device according to claim 11, wherein the clock detector comprises:

a first frequency meter receiving the reference clock signal and calculating the frequency of the reference clock signal to generate a first frequency;

a second frequency meter receiving the fixed clock signal and calculating the frequency of the fixed clock signal to generate a second frequency; and a comparator coupled to the first frequency meter and the second frequency meter and comparing the first frequency and the second frequency;

wherein when there is the specific ratio relationship between the first frequency and the second frequency, the comparator generates the notification signal to the chip controller.

13. The integrated circuit device according to claim 11, wherein the specific ratio relationship is the relationship between the frequency of the reference clock signal and the frequency of the fixed clock signal.

14. The integrated circuit device according to claim 11, wherein the frequency of the fixed clock signal is lower than the frequency of the reference clock signal.

15. The integrated circuit device according to claim 11, wherein the first chip element is a flash memory controller or a double data rate (DDR) controller.

16. The integrated circuit device according to claim 11, wherein the second chip element is a bus controller.

17. The integrated circuit device according to claim 11, wherein when the sideband signal is at the low-level, the frequency of the reference clock signal generated from the main system processor is unstable.

18. The integrated circuit device according to claim 11, wherein after the main system processor generates the sideband signal with the low-level for a period of time, the main system processor generates the sideband signal with a high-level.

19. The integrated circuit device according to claim 18, wherein when the sideband signal is at the high-level, the frequency of the reference clock signal generated from the main system processor is stable.

20. The integrated circuit device according to claim 11, wherein the fixed clock signal is generated from an oscillator.

* * * * *